(12) United States Patent
Cho et al.

(10) Patent No.: US 7,195,962 B2
(45) Date of Patent: Mar. 27, 2007

(54) ULTRA SHORT CHANNEL FIELD EFFECT TRANSISTOR AND METHOD OF FABRICATING THE SAME

(75) Inventors: Wonju Cho, Daejeon (KR); Seong Jae Lee, Daejeon (KR); Jong Heon Yang, Daejeon (KR); Jihun Oh, Daejeon (KR); Kiju Im, Daejeon (KR); Chang Geun Anh, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/833,452

(22) Filed: Apr. 27, 2004

(65) Prior Publication Data
US 2005/0009250 A1    Jan. 13, 2005

(30) Foreign Application Priority Data
Jun. 27, 2003    (KR) ............... 10-2003-0042766

(51) Int. Cl.
*H01L 21/00*    (2006.01)
(52) U.S. Cl. ............................ 438/161; 257/E21.415
(58) Field of Classification Search ............... 438/161
See application file for complete search history.

(56) References Cited

U.S. PATENT DOCUMENTS 6,033,963 A    3/2000    Huang et al.
6,093,592 A *  7/2000    Nakabayashi et al. ...... 438/221
6,225,173 B1   5/2001    Yu
6,864,520 B2 * 3/2005    Fischetti et al. ............. 257/255

OTHER PUBLICATIONS

Saito et al., "Suppression of Short Channel Effect in Triangular Parallel Wire Channel MOSFETs", IEEE Silicon Nanoelectronics Workshop, pp. 6-7, Jun. 10-11, 2001.*
H-H. Voung, et al., "Design of 25 = . nm SALVO PMOS Devices", IEEE Electron Device Letters, vol. 21, No. 5, May 2000 (3 pp.).
J. Gondemann, et al., "a Triangle-shaped Nanoscale Metal-oxide-semiconductor Device", J.vac.sci. Technol. B 14(6), Nov./Dec. 1996 (pp. 4042-4045).

* cited by examiner

*Primary Examiner*—Chandra Chaudhari
(74) *Attorney, Agent, or Firm*—Blakely Sokoloff Taylor & Zafman

(57) ABSTRACT

Provided is a MOSFET with an ultra short channel length and a method of fabricating the same. The ultra short channel MOSFET has a silicon wire channel region with a three-dimensional structure, and a source/drain junction formed in a silicon conductive layer formed of both sides of the silicon wire channel region. Also, a gate electrode formed on the upper surface of the silicon wire channel region by interposing a gate insulating layer having a high dielectric constant therebetween, and source and drain electrodes connected to the source/drain junction are included. The silicon wire channel region is formed with a triangular or trapezoidal section by taking advantage of different etch rates that depend on the planar orientation of the silicon. The source/drain junction is formed by a solid-state diffusion method.

15 Claims, 5 Drawing Sheets

ULTRA SHORT CHANNEL FIELD EFFECT TRANSISTOR AND METHOD OF FABRICATING THE SAME

BACKGROUND OF THE INVENTION

This application claims the priority of Korean Patent Application No. 2003-42766, filed on Jun. 27, 2003, in the Korean Intellectual Property Office, the disclosure of which is incorporated herein in its entirety by reference.

1. Field of the Invention

The present invention relates to a Metal-Oxide-Semiconductor Field Effect Transistor (MOSFET) and a method of fabricating the same, and more particularly to an ultra short channel MOSFET having a channel of nm dimension and a method of fabricating the same.

2. Description of the Related Art

As the dimensions of silicon semiconductor devices decrease in order to attain low power dissipation, high packing density and high-speed operation, it is especially necessary in a MOSFET to secure a shrunken channel length, shallower junction depth of source and drain regions and a thinner gate oxide layer. Also, even in devices with equal dimensions, performance can be improved by increasing driving current and decreasing leakage current. However, a transistor of microscopic dimensions fabricated using a typical process requires highly strict processing conditions and very expensive processing equipment to reduce the channel length.

For example, a micro-device having a channel of nm dimension cannot be fabricated by a conventional photolithography process but must be fabricated using a pattern formation technique that uses e-beam direct writing, Extreme Ultra Violet (EUV) exposure or X-ray exposure. Thus, fabricating costs of the silicon device are large and mass production is very difficult. Furthermore, conventional source and drain formation techniques such as ion implantation or plasma doping not only involve a difficulty in forming a shallow junction, but also produce a defect in a substrate resulting from implantation, thereby degrading device characteristics and requiring demanding highly expensive junction forming equipment.

Moreover, as device dimensions are decreased, the gate oxide layer becomes thinner, resulting in a possible gate leakage current. Research has done into finding a material with a higher dielectric constant as a gate oxide layer so as to decrease the gate leakage current. However, in a conventional device, since the gate oxide layer is formed prior to forming a source and a drain formed by ion implantation, a processing temperature of a subsequent activating thermal treatment is restricted.

A replacement gate structure has been suggested as an alternative but requires a fabrication process in which a self-aligning process of the gate and source/drain is highly complicated. Accordingly, a process of fabricating a microscopic device is required for solving the above-enumerated problems and embodying an integrated circuit with high packing density and high performance.

SUMMARY OF THE INVENTION

The present invention provides an ultra short channel MOSFET that is highly reliable and has a high packing density.

The present invention also provides a method of fabricating an ultra short channel MOSFET in a facilitated manner at a low cost.

According to an aspect of the present invention, there is provided an ultra short channel MOSFET including a silicon wire channel region with a three-dimensional structure. A source/drain junction is formed in a silicon conductive layer formed on both sides of the silicon wire channel region, and a gate electrode is formed on an upper surface of the silicon wire channel region by interposing a gate insulating layer having a high dielectric constant therebetween. Source and drain electrodes are connected to the source/drain junction.

According to another aspect of the present invention, there is provided a method of fabricating an ultra short channel MOSFET. A silicon wire channel region with a three-dimensional structure is formed by a planar-orientation dependent wet etching upon a single-crystal silicon layer, and forming a source/drain junction on both sides of the silicon wire channel region by forming a silicon conductive layer via solid-state diffusion. Thereafter, a gate electrode is formed on an upper surface of the silicon wire channel region by interposing a gate insulating layer having a higher dielectric constant therebetween, and the source and drain electrodes are formed in the source/drain junction.

According to still another aspect of the present invention, there is provided a method of fabricating an ultra short channel MOSFET in which an SOI substrate is formed by sequentially stacking a single-crystal silicon substrate, a buried oxide layer and a single-crystal silicon layer. A mask pattern defining a region for a channel is formed on the single-crystal silicon layer. Then, after the single-crystal silicon layer is anisotropically wet etched using the mask pattern as an etch mask, a single-crystal silicon pattern with a three-dimensional structure is formed to be used as the channel. Then, a silicon conductive layer serving as source and drain is formed to the left and right of the single-crystal silicon pattern by depositing the silicon conductive layer including an impurity on the single-crystal silicon pattern and mask pattern, which is planarized by chemical mechanical polishing using the mask pattern as an end point. After forming an insulating layer on the silicon conductive layer with a window corresponding to the single-crystal silicon pattern, the mask pattern below the window is removed, thereby exposing an upper surface of the single-crystal silicon pattern. Spacers are formed along the inner walls of the window, and a gate insulating layer is formed on the entire surface of the intermediate structure including the oxide layer spacers. Thereafter, a gate electrode is formed on the gate insulating layer thereby filling the window, and the gate insulating layer and insulating layer are removed from both sides of the gate electrode, thereby exposing the silicon conductive layer. Finally, source and drain electrodes are formed on the exposed silicon conductive layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
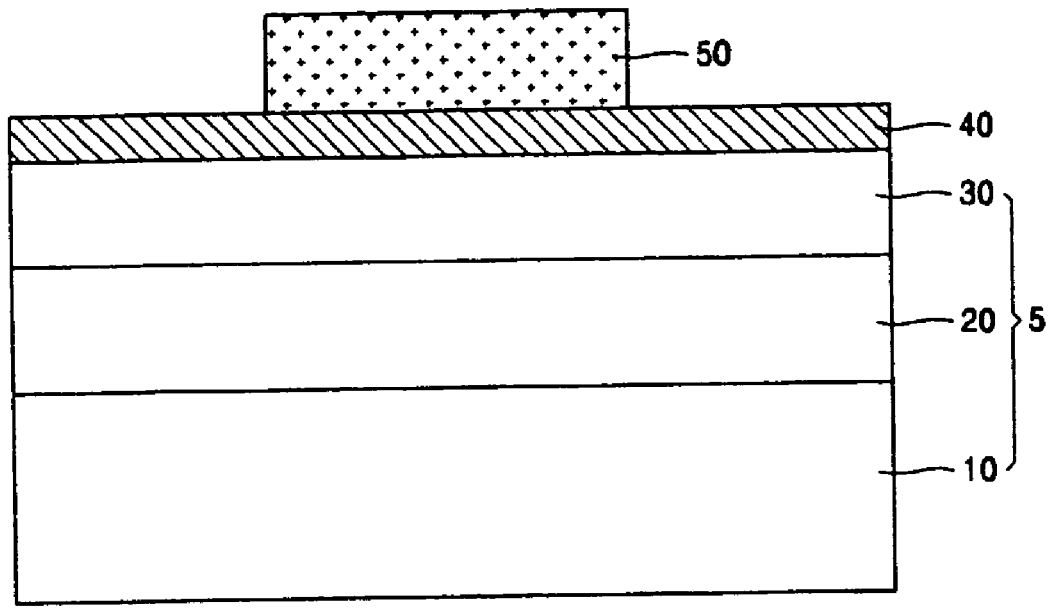
FIGS. 1 to 9 are sectional views illustrating a method of fabricating an ultra short channel MOSFET according to an embodiment of the present invention.

In the present invention, the same reference characters refer to the same elements. In the drawings, thickness of layers and regions are exaggerated for clarity. Additionally, devices may be electrically separated via mesa etch.

FIGS. 1 to 9 are sectional views illustrating a method of fabricating an ultra short channel MOSFET according to an embodiment of the present invention.

Referring to FIG. 1, an SOI substrate 5 is obtained by sequentially stacking a buried oxide layer 20, and a single-crystal silicon layer 30 on a single-crystal silicon substrate 10. Although a general silicon substrate having <100> planar orientation may also be used, it is preferable that the SOI substrate 5 is used in order to maximally prevent leakage current and optimize an ultra short channel transistor process. In particular, it is difficult to form a shallow junction of source and drain regions in a micro-device of nm dimensions using a single-crystal silicon substance other than SOI, reliability of the device and electrical isolation between devices cannot be obtained. Then, a silicon oxide layer 40 is deposited on the single-crystal silicon layer 30 by one of thermal oxidation, Chemical Vapor Deposition (CVD), sputtering, spin coating, and so on. Then, a first photoresist pattern 50 is formed on the silicon oxide layer 40 to shield a region in the single-crystal silicon layer 30 in which a channel is to be formed.

Figure 2:
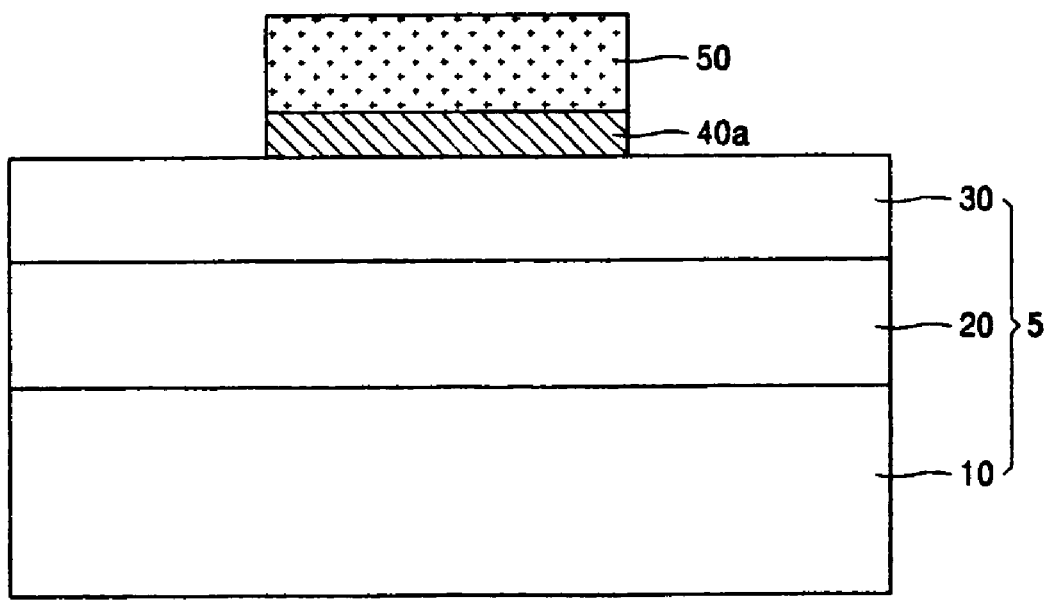

Referring to FIG. 2, the silicon oxide layer 40 is etched using the first photoresist pattern 50 as an etch mask. Thus, a silicon oxide pattern 40a defining the region in which a channel is to be formed is disposed under the first photoresist pattern 50.

Figure 3:
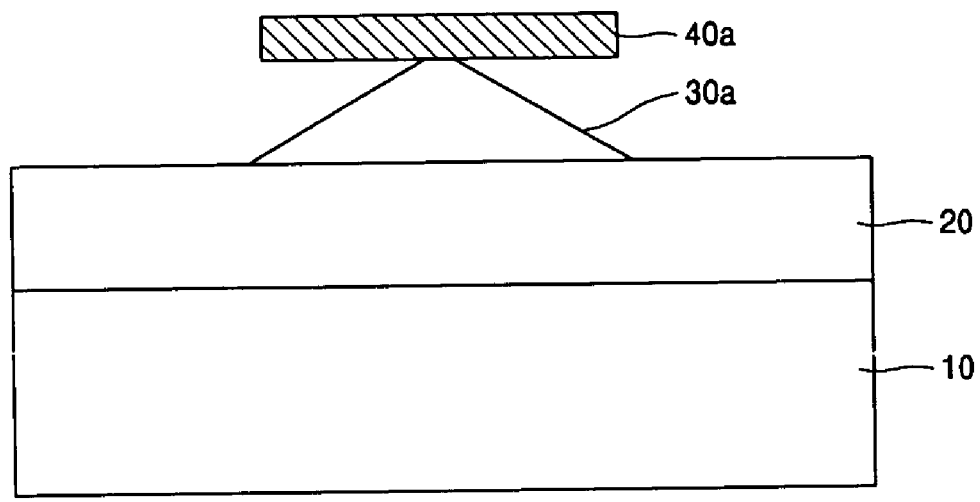

Referring to FIG. 3, after removing the first photoresist pattern 50 by ashing and stripping, the single-crystal silicon layer 30 is anisotropically and selectively etched using the silicon oxide pattern 40a as an etch mask and KOH, a TetraMethylAmmoniumHydroxide (TMAH) solution or a TMAH-containing photoresist developing solution (e.g., MIF-500) as an etchant. The single-crystal silicon layer 30 is etched at a different rate according to the planar orientation by KOH, TMAH solution or photoresist developing solution containing TMAH. More specifically, when being dropped in the foregoing solution, a (100) plane of silicon is etched about twice as fast as (111) of silicon. (100) plane of silicon has a specific sloped with respect to (111) plane. Accordingly, as shown in FIG. 3, when the single-crystal silicon layer 30 is etched, (111) plane is etched relatively slowly, thereby forming a single-crystal silicon pattern 30a, which has a triangular or trapezoidal cross-sectional shape. An angle between (100) plane corresponding to the bottom and (111) plane corresponding to the side is approximately 54.74°. Thus, a three-dimensional structure having a triangular or trapezoidal section can be easily formed without using a complicated and difficult method such as lithography. The silicon oxide pattern 40a is hardly etched and is utilized as an end point of a subsequent CMP process. The sectional shape of the single-crystal pattern 30a nears a triangular shape when the duration of etching the single-crystal silicon layer 30 is increased. The single-crystal silicon layer 30a has a three-dimensional wire shape, which is employed as a channel of the MOSFET. The three-dimensional structure facilitates a decrease of the channel length over the conventional structure. Consequently, without using a separate photo mask or complicated etching equipment for decreasing the channel length, an ultra short channel can be formed via a simple process of wet etching. In other words, in the present invention, the ultra short channel can be easily formed without a photomask and lithography process, which are obstacles when forming an ultra short channel of nm dimension.

Figure 4:
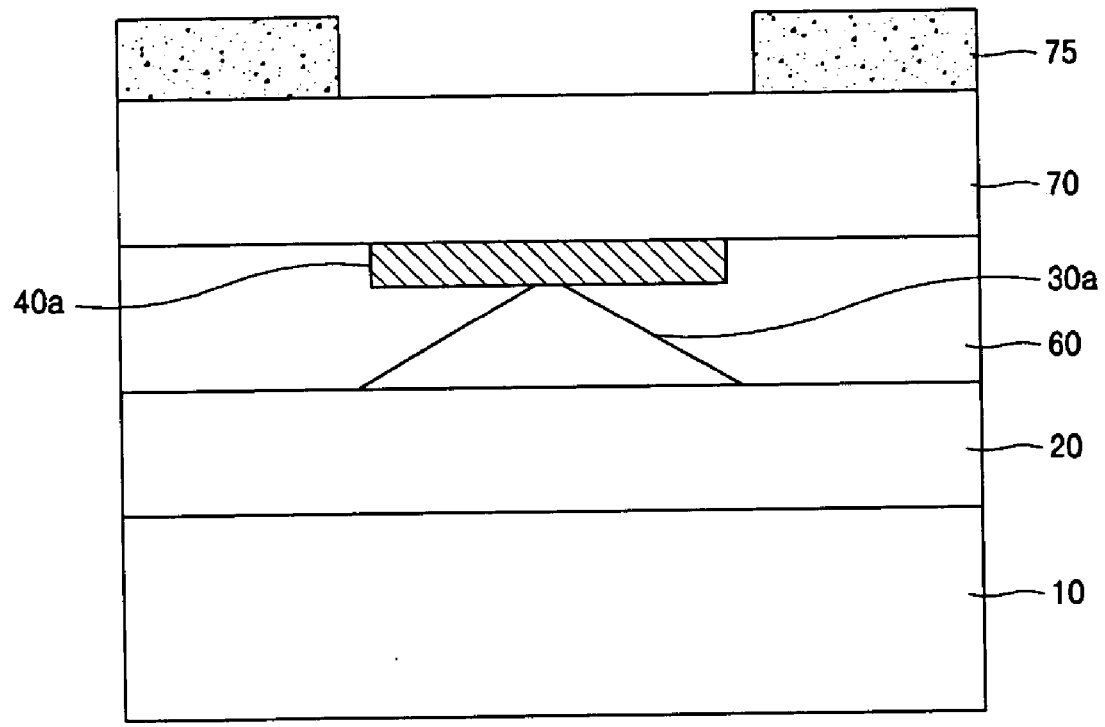

Referring to FIG. 4, a doped silicon is deposited on the buried oxide layer 20, the single-crystal silicon pattern 30a and the silicon oxide pattern 40a by CVD and so on, and then CMP is performed using the silicon oxide pattern 40a as an end point. Therefore, a silicon conductive layer 60 having an upper surface that forms a plane with an upper surface of the silicon oxide pattern 40a is formed. The silicon conductive layer 60 is formed of amorphous or polycrystalline silicon doped with an N-type or P-type impurity, which functions as source and drain adjacent to the single-crystal silicon pattern 30a is deposited by the silicon conductive layer 60 by in-situ doping in which the silicon and an impurity gas are deposited simultaneously or by doping an impurity using vapor- or solid-state diffusion after depositing an undoped thin film. As opposed to the conventional method of forming a source/drain junction by an ion implantation after forming a gate insulating layer and a gate electrode, the source/drain junction is formed in the substrate in advance by solid-state diffusion as described above. As a result, it is possible to lower a thermal treatment temperature of a subsequent process and to prevent defects in the substrate. Thus, junction leakage current can be decreased, which in turn allows for fabricating a device with a high performance ultra short channel capable of simultaneously reducing electric power dissipation and improving reliability.

Next, a silicon nitride layer 70 is deposited on the silicon oxide pattern 40a and the silicon conductive layer 60. The silicon nitride layer 70 electrically isolates an electrode to be formed on the upper portion thereof from the source/drain junction.

The silicon nitride layer 70 may be deposited at a temperature of 500 to 850° C. via CVD such as a Low Pressure CVD (LPCVD) that uses a reaction of $SiH_4$ and $NH_3$. The silicon nitride layer 70 can have a thickness of 10 to 300 nm. Then, a second photoresist pattern 75 that exposes a portion corresponding to the single-crystal silicon pattern 30a is formed on the silicon nitride layer 70.

Figure 5:
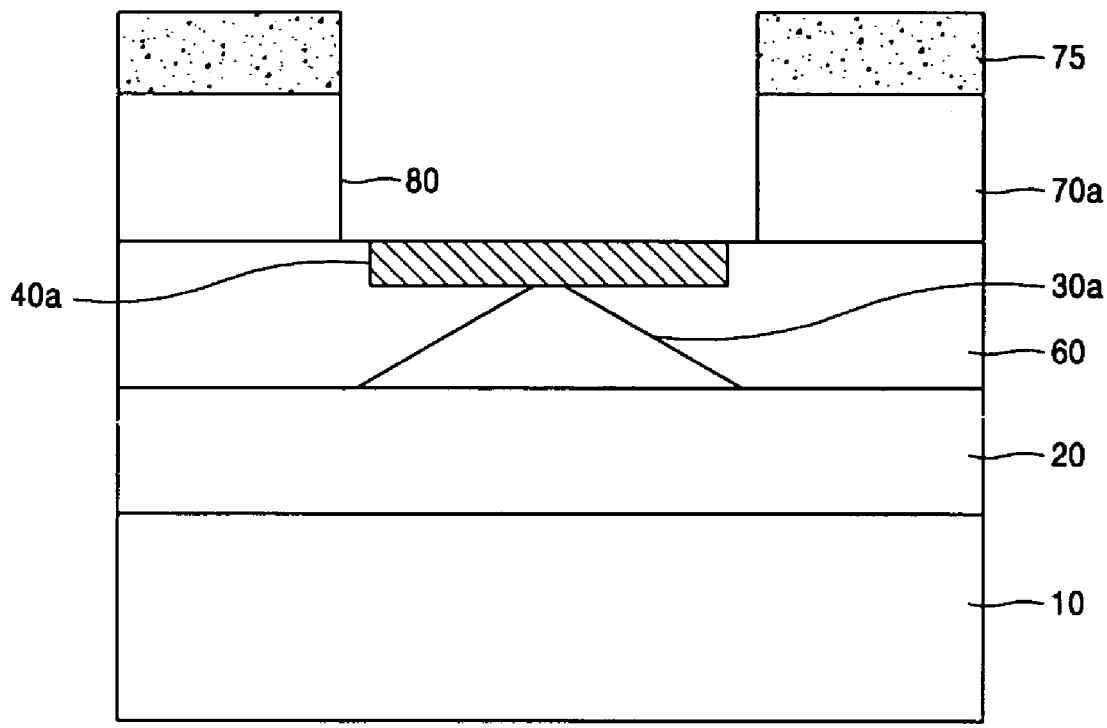

Referring to FIG. 5, the silicon nitride layer 70 is dry etched using the second photoresist pattern 75 as an etch mask, thus forming a silicon nitride layer pattern 70a that defines a window 80 in which a gate electrode will be formed over the single-crystal silicon pattern 30a. It is preferable that the window 80 is large enough to expose the silicon oxide pattern 40a.

Figure 6:
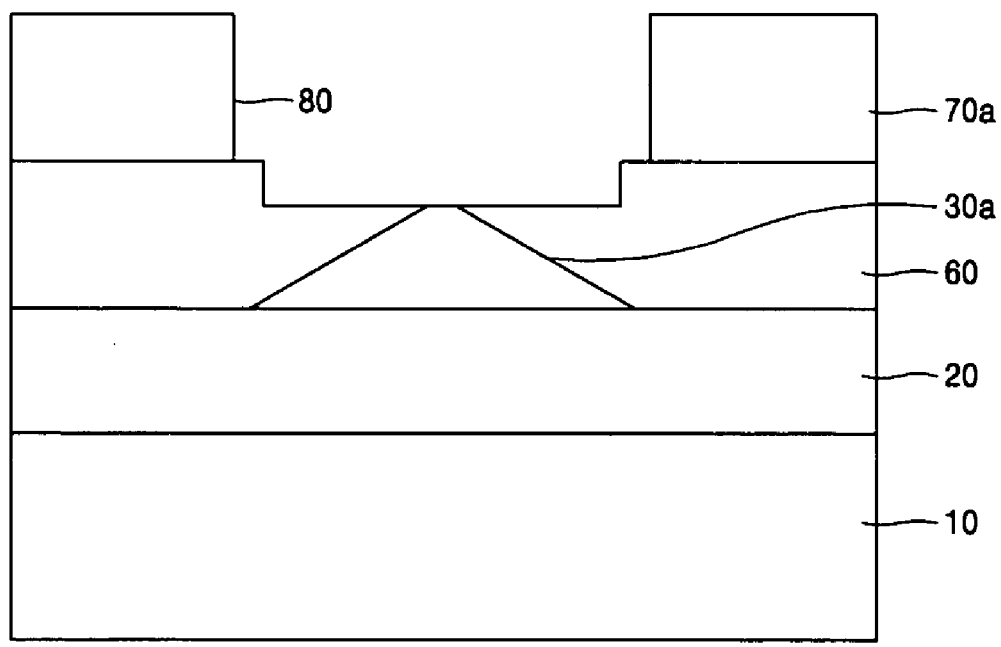

Referring to FIG. 6. after removing the second photoresist pattern 75, the silicon oxide pattern 40a is removed to expose an upper portion of the single-crystal silicon pattern 30a.

Figure 7:
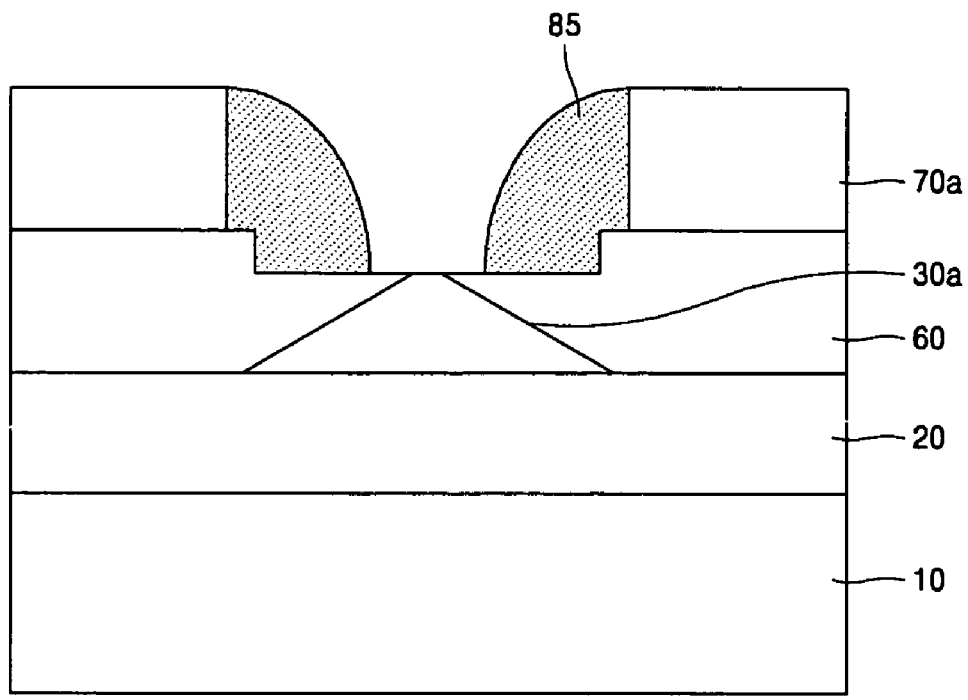

Referring to FIG. 7, a silicon oxide layer is deposited over the whole surface of the intermediate structure so as not to completely fill the window 80, e.g., to a thickness of 10 to 300 nm. Then, an etchback process is performed by dry etching, thereby forming spacers 85 along sidewalls of the silicon nitride layer pattern 70a. By adjusting the thickness of the oxide layer spacer 85, the length of the gate electrode, which decreases a capacitance of the gate electrode and source/drain junction, to be formed within the window 80 can be controlled.

Figure 8:
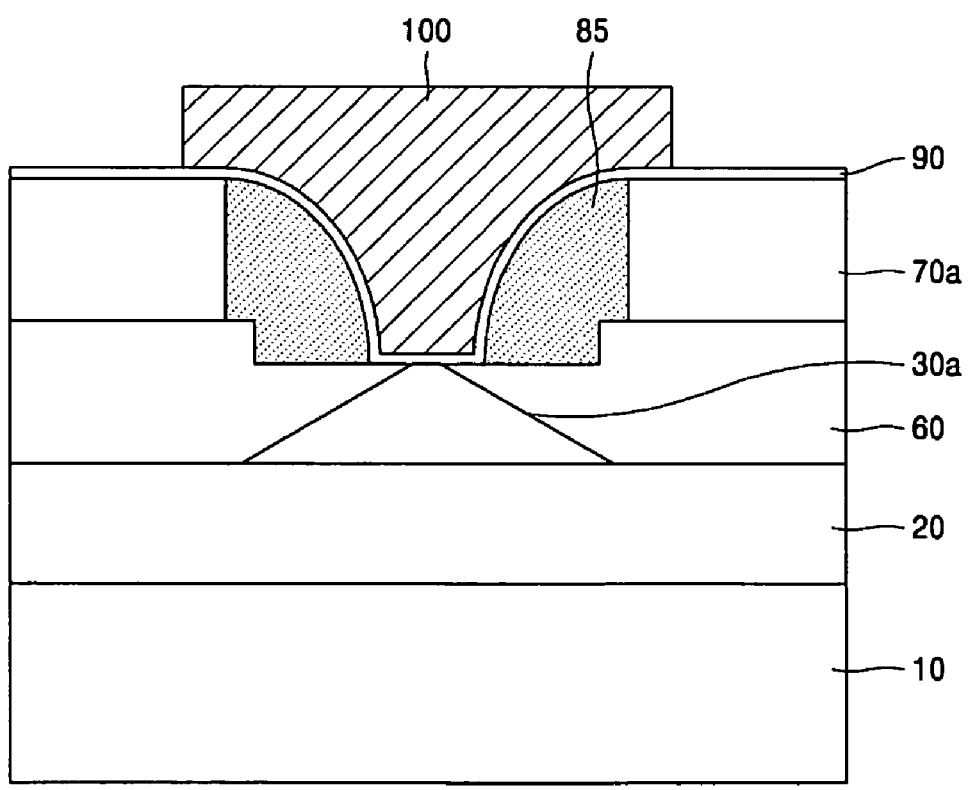

Then referring to FIG. 8, an insulating layer 90 having a high dielectric constant is formed on the exposed surfaces of the silicon nitride layer pattern 70a, the window 80 and the oxide spacers 85. The insulating layer 90 is used as a gate insulating layer. The silicon conductive layer 60, which functions as the source and drain, is formed using the solid-state diffusion method, thereby allowing all processes to be carried out at a low temperature. The insulating layer 90 may be any high dielectric insulating layer such as a titanium oxide layer, a tantalum oxide layer, a hafnium oxide layer and zirconium oxide layer, formed by a typical depositing method such as CVD, Sub-Atmospheric CVD (SACVD), Metal Organic CVD (MOCVD), Atomic Layer Deposition (ALD), LPCVD and Plasma Enhanced CVD (PECVD).

Thereafter, a gate electrode 100 is formed on the insulating layer 90, thereby filling the window 80. The gate electrode 100 may be formed of highly doped polycrystalline silicon or a metal such as tungsten or aluminium. The highly doped polycrystalline silicon layer may be deposited via LPCVD at a temperature of 500 to 700° C. The highly doped polycrystalline silicon layer may be formed by depositing a film, and doping the film with arsenic or phosphor by ion implantation, it may be formed by in-situ doping. Typically, a material layer for the gate electrode 100 is deposited and then patterned using a lithography process. However, when a metal such as tungsten or aluminium can be formed via sputtering at a low temperature, these material layers are deposited to form the gate electrode 100 in a desired shape by using a lift-off method with a photoresist pattern that defines the form of the gate electrode 100 prepared in advance.

In the fabrication of the memory device as described above, the temperature of thermal treatment after forming the gate insulating layer is lowered to minimize variation of the impurity density in the channel, thereby decreasing variations in a threshold voltage of the device and preventing degradation of the device characteristic caused by a short channel effect. Also because of the thermal treatment at a low temperature, it is easy to using the gate insulating layer having a high dielectric constant. Therefore, the device structure can include not only polycrystalline silicon, but also metal as gate electrode 100.

Figure 9:
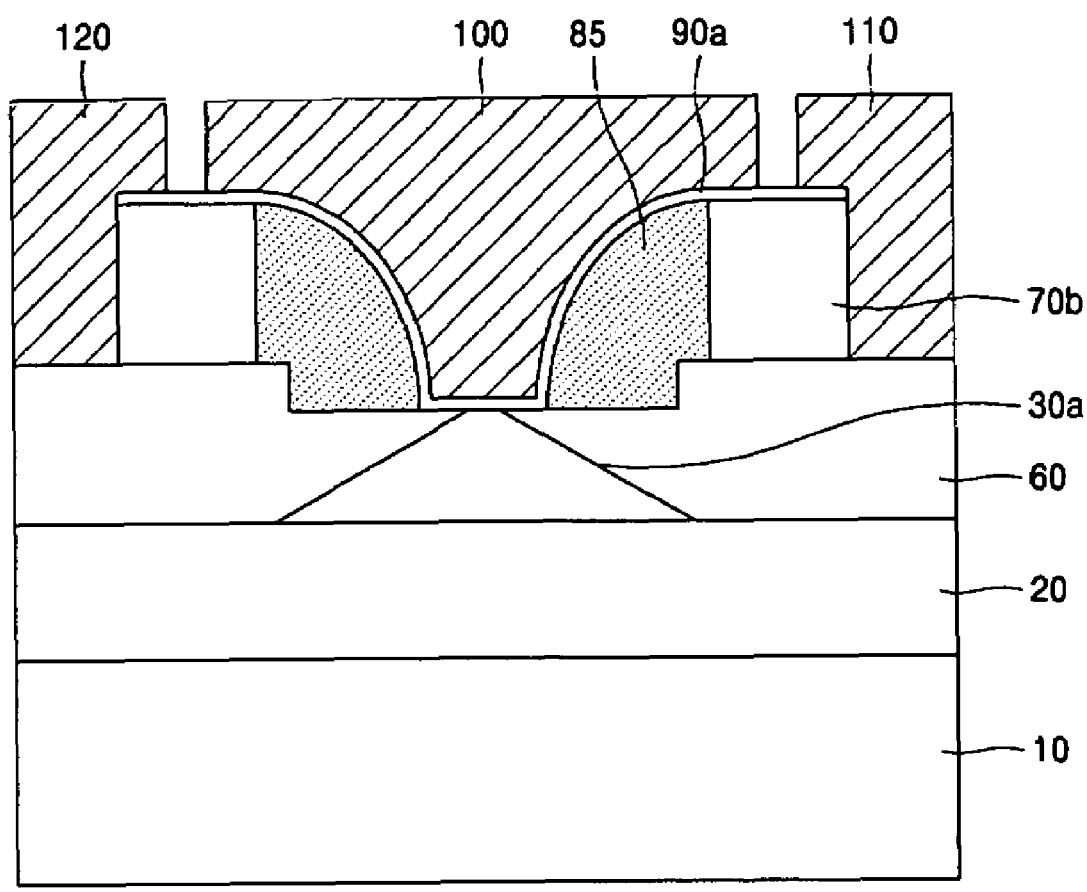

Finally, referring to FIG. 9, portions of the insulating layer 90 having a high dielectric constant and silicon nitride layer pattern 70a are removed from both sides of the gate electrode 100 to expose portions of an upper surface of the silicon conductive layer 60. Then, source and drain electrodes 110 and 120 are formed on respective portions thereof. Reference numeral 90a denotes a portion of the gate insulating layer left under the gate electrode 100, and 70b denotes a portion of the silicon nitride layer pattern remaining after being etched. When the source and drain electrodes 110/120 are formed of metal such as tungsten or aluminium, the source and drain electrodes 110/120 can be formed by a lift-off method. However, the source and drain electrodes 110/120 can be formed of highly doped polycrystalline silicon that is patterned in the form of the electrode by lithography after the deposition.

The ultra short channel MOSFET according to the present invention utilizes the single-crystal silicon layer 30a (ultra short silicon wire) having a triangular or trapezoidal structure as a channel that connects the source/drain junctions by using the silicon conductive layer 60. When a high electric field is formed in an upper portion (i.e., the apex of the triangle) of the single-crystal silicon layer 30a by applying a suitable voltage to the gate electrode 100, the volume of the conductive channel on the lower portion of the gate electrode 100 is increased. The horizontal dimension of the device can be decreased by the three-dimensional current flow under the general operating conditions, thereby attaining high packing density. Also, since the SOI substrate 5 is used, it is possible to expect very fast device operation.

According to the present invention, the ultra short channel can be easily formed by using the etching characteristics that depend on the planar orientation of the silicon without using a photomask and a lithography process, which are major obstacles when forming the ultra short channel of nm dimension. That is, neither a separate photo mask nor complicated etching equipment is employed in attaining the ultra short channel.

Furthermore, in the ultra short channel MOSFET according to the present invention, electrical source and drain are formed prior to forming the gate insulating layer by using a silicon conductive layer without using ion implantation. Therefore, several processes associated with the ion implantation can be omitted, thereby reducing costs. In particular, variations in the threshold voltage of the device are prevented since the impurity activation process is omitted. Furthermore, impurity distribution throughout the channel is more uniform, a thermal treatment process can be performed at a low temperature and use a gate insulating layer having a high dielectric constant is facilitated. As a result, it is highly favorable to form the gate electrode of metal as well as polycrystalline silicon. Moreover, diffusion of the impurity from a solid-state diffusion source inhibits a crystal defect of the substrate.

In conclusion, the ultra short channel transistor according to the present invention has a decreased leakage current through a junction and simultaneously attains a decreased power dissipation and improved reliability, and the method of fabricating the ultra short channel transistor according to the present invention is highly effective in providing the SOI MOSFET with an ultra short channel with a high packing density.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating an ultra short channel MOSFET comprising:
   forming a silicon wire channel region with a three-dimensional structure by using a planar-orientation dependent wet etching method upon a single-crystal silicon layer;
   forming a source/drain junction on both sides of the silicon wire channel region by forming a silicon conductive layer using solid-state diffusion, wherein a vertical plane connecting the source/drain junction on both sides defines a cross-section of the three-dimensional structure, the cross-section having a lower portion and an upper portion, the lower portion and the upper portion having different widths;
   forming a gate electrode on an upper surface of the silicon wire channel region with a gate insulating layer having a high dielectric constant interposed therebetween; and
   forming source and drain electrodes on the source/drain junction.

2. The method of fabricating an ultra short channel MOSFET as claimed in claim 1, wherein the silicon wire channel region is formed with a triangular or trapezoidal cross-section.

3. The method of fabricating an ultra short channel MOSFET as claimed in claim 1, wherein the silicon conductive layer is formed by depositing amorphous or polycrystalline silicon doped with an N-type or P-type impurity, and performing planarizing by a chemical mechanical polishing.

4. The method of fabricating an ultra short channel MOSFET as claimed in claim 1, wherein an etchant used to wet etch the single-crystal silicon layer is KOH, a TMAH mixture solution or a TMAH-containing photoresist developing solution.

5. The method of fabricating an ultra short channel MOSFET as claimed in claim 1, wherein the gate insulating layer is a titanium oxide layer, a tantalum oxide layer, a hafnium oxide layer or a zirconium oxide layer.

6. The method of fabricating an ultra short channel MOSFET as claimed in claim 1, wherein the gate electrode and source and drain electrodes are formed of highly doped polycrystalline silicon or metal.

7. A method of fabricating an ultra short channel MOSFET comprising:
   forming an SOI substrate by sequentially stacking a single-crystal silicon substrate, a buried oxide layer and a single-crystal silicon layer;
   forming a mask pattern that defines a region to be formed with a channel on the single-crystal silicon layer;
   anisotropically etching the single-crystal silicon layer by wet etching using the mask pattern as an etch mask, thereby forming a single-crystal silicon pattern with a three-dimensional structure to be used as the channel;
   forming a silicon conductive layer that serves as a source and a drain at the left and right of the single-crystal silicon pattern by depositing the silicon conductive layer with an impurity on the single-crystal silicon pattern and the mask pattern, and planarizing the silicon conductive layer by chemical mechanical polishing by using the mask pattern as an end point;
   forming an insulating layer on the silicon conductive layer, and forming a window in a portion corresponding to the single-crystal silicon pattern;
   removing a portion of the mask pattern underlying the window, thereby exposing an upper portion of the single-crystal silicon pattern;
   forming spacers along the inner walls of the window;
   forming a gate insulating layer on the whole surface of the intermediate structure in which the oxide layer spacers are formed;
   forming a gate electrode on the gate insulating layer, thereby filling the window;
   removing the gate insulating layer and insulating layer from both sides of the gate electrode, thereby exposing the silicon conductive layer; and
   forming source and drain electrodes on the exposed silicon conductive layer.

8. The method of fabricating an ultra short channel MOSFET as claimed in claim 7, wherein an etchant used to wet etch the single-crystal silicon layer is KOH, a TMAH mixture solution or a TMAH-containing photoresist developing solution.

9. The method of fabricating an ultra short channel MOSFET as claimed in claim 7, wherein the gate insulating layer is a titanium oxide layer, a tantalum oxide layer, a hafnium oxide layer or a zirconium oxide layer.

10. The method of fabricating an ultra short channel MOSFET as claimed in claim 7, wherein the gate electrode and source and drain electrodes are formed of highly doped polycrystalline silicon or metal.

11. The method of fabricating an ultra short channel MOSFET as claimed in claim 7, wherein the single-crystal silicon layer has a <100> planar orientation.

12. The method of fabricating an ultra short channel MOSFET as claimed in claim 7, wherein the mask pattern comprises a silicon oxide layer, and the insulating layer is a silicon nitride layer.

13. The method of fabricating an ultra short channel MOSFET as claimed in claim 7, wherein the insulating layer is formed by depositing a silicon nitride layer via a CVD method to a thickness of 10 to 300 nm.

14. The method of fabricating an ultra short channel MOSFET as claimed in claim 7, wherein the window is large enough to thoroughly expose the mask pattern.

15. The method of fabricating an ultra short channel MOSFET as claimed in claim 7, wherein the spacer is formed by depositing an oxide layer to a thickness of 10 to 300 nm via a CVD method, and is subjected to etchback via a dry etching method.

* * * * *